United States Patent
Bonavides et al.

(10) Patent No.: US 10,024,152 B2
(45) Date of Patent: Jul. 17, 2018

(54) IMPROVING RELIABILITY IN A HIGH-TEMPERATURE ENVIRONMENT

(71) Applicants: Halliburton Energy Services, Inc., Houston, TX (US); Clovis S. Bonavides, Houston, TX (US); William George Dillon, Houston, TX (US)

(72) Inventors: Clovis S. Bonavides, Houston, TX (US); William George Dillon, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/031,324

(22) PCT Filed: Dec. 27, 2013

(86) PCT No.: PCT/US2013/078010
§ 371 (c)(1),
(2) Date: Apr. 22, 2016

(87) PCT Pub. No.: WO2015/099769
PCT Pub. Date: Jul. 2, 2015

(65) Prior Publication Data
US 2016/0258272 A1    Sep. 8, 2016

(51) Int. Cl.
*E21B 47/017*    (2012.01)
*E21B 36/00*    (2006.01)
(Continued)

(52) U.S. Cl.
CPC ........ *E21B 47/011* (2013.01); *B29C 67/0051* (2013.01); *H05K 5/0213* (2013.01);
(Continued)

(58) Field of Classification Search
CPC .......................... E21B 36/001; E21B 47/011
See application file for complete search history.

(56) References Cited

U.S. PATENT DOCUMENTS 3,957,056 A * 5/1976 Comben ................ A61N 1/378
220/612
6,052,280 A    4/2000 Dilley et al.
(Continued)

FOREIGN PATENT DOCUMENTS

EP    1625336 B1    8/2011

OTHER PUBLICATIONS

International Searching Authority, The International Search Report and Written Opinion, International Application No. PCT/US2013/078010, which is a PCT parent of the instant application, dated Apr. 24, 2014.
(Continued)

*Primary Examiner* — Robert Edward Fuller
(74) *Attorney, Agent, or Firm* — Howard L. Speight, PLLC

(57) ABSTRACT

A housing contains an internal volume. A heat-sensitive device is contained by the housing and consumes a device percentage of the internal volume. The device percentage equals the percentage of the internal volume of the housing consumed by the heat-sensitive device. A phase-change material is positioned within the housing to conduct heat from the heat-sensitive device. The phase-change material consumes a percentage of the internal volume equal to 100 percent minus the device percentage minus an expansion percentage. The phase-change material expands in volume by an amount more than 75 percent of the expansion percentage upon occurrence of a phase-change event.

18 Claims, 3 Drawing Sheets

(51) Int. Cl.
*E21B 47/01* (2012.01)
*H05K 5/02* (2006.01)
*B29C 67/00* (2017.01)
*B33Y 10/00* (2015.01)
*B33Y 50/02* (2015.01)
*B29L 31/00* (2006.01)

(52) U.S. Cl.
CPC ......... *B29L 2031/757* (2013.01); *B33Y 10/00* (2014.12); *B33Y 50/02* (2014.12)

(56) References Cited

U.S. PATENT DOCUMENTS

| | | | |
|---|---|---|---|
| 6,336,408 B1 | 1/2002 | Parrott et al. | |
| 6,703,128 B2 | 3/2004 | Myers et al. | |
| 7,921,913 B2 * | 4/2011 | Tchakarov | E21B 47/011 166/162 |
| 8,395,056 B2 | 3/2013 | Nakamura et al. | |
| 2003/0202306 A1 | 10/2003 | Dubhashi | |
| 2004/0112601 A1 * | 6/2004 | Hache | E21B 36/001 166/302 |
| 2005/0005624 A1 * | 1/2005 | DiFoggio | E21B 36/003 62/259.2 |
| 2006/0144619 A1 | 7/2006 | Storm et al. | |
| 2009/0154113 A1 * | 6/2009 | MacDonald | H05K 7/20518 361/720 |
| 2009/0321046 A1 * | 12/2009 | Hernon | F28F 13/02 165/80.3 |
| 2010/0163250 A1 | 7/2010 | Schultz et al. | |
| 2010/0163280 A1 | 7/2010 | Sasaki | |
| 2010/0256708 A1 * | 10/2010 | Thornton | A61N 1/375 607/61 |
| 2011/0042075 A1 | 2/2011 | Hammami et al. | |
| 2012/0272679 A1 | 11/2012 | Vreeland et al. | |
| 2013/0008638 A1 | 1/2013 | Quinn et al. | |
| 2013/0320598 A1 | 12/2013 | Atkins et al. | |
| 2015/0130283 A1 * | 5/2015 | Zilbershlag | A61N 1/378 307/66 |

OTHER PUBLICATIONS

M. Schimmelpfenig, K. Weber, F. Kalib, K.-H Feller, T. Butz, M. Matthai, Volume expansion of paraffins from dip tube measurements.

Rainer Tamme, Phase—Change Storage Systems, DLR—German Aerospace Center Institute of Technical Thermodynamics, Workshop on Thermal Storage for Trough Power Systems, Feb. 20-21, 2003.

International Preliminary Examining Authority, Patent Cooperation Treaty, Corrected International preliminary report on Patentability, International application No. PCT/US13/78010, which is a PCT parent to the instant application, dated Jul. 6, 2016.

* cited by examiner

IMPROVING RELIABILITY IN A HIGH-TEMPERATURE ENVIRONMENT

BACKGROUND

The reliability of devices that operate in high-temperature environments, such as downhole oil field tools, may suffer when the devices are exposed to heat. Improving the reliability of such devices is a challenge.

DETAILED DESCRIPTION

Figure 1:
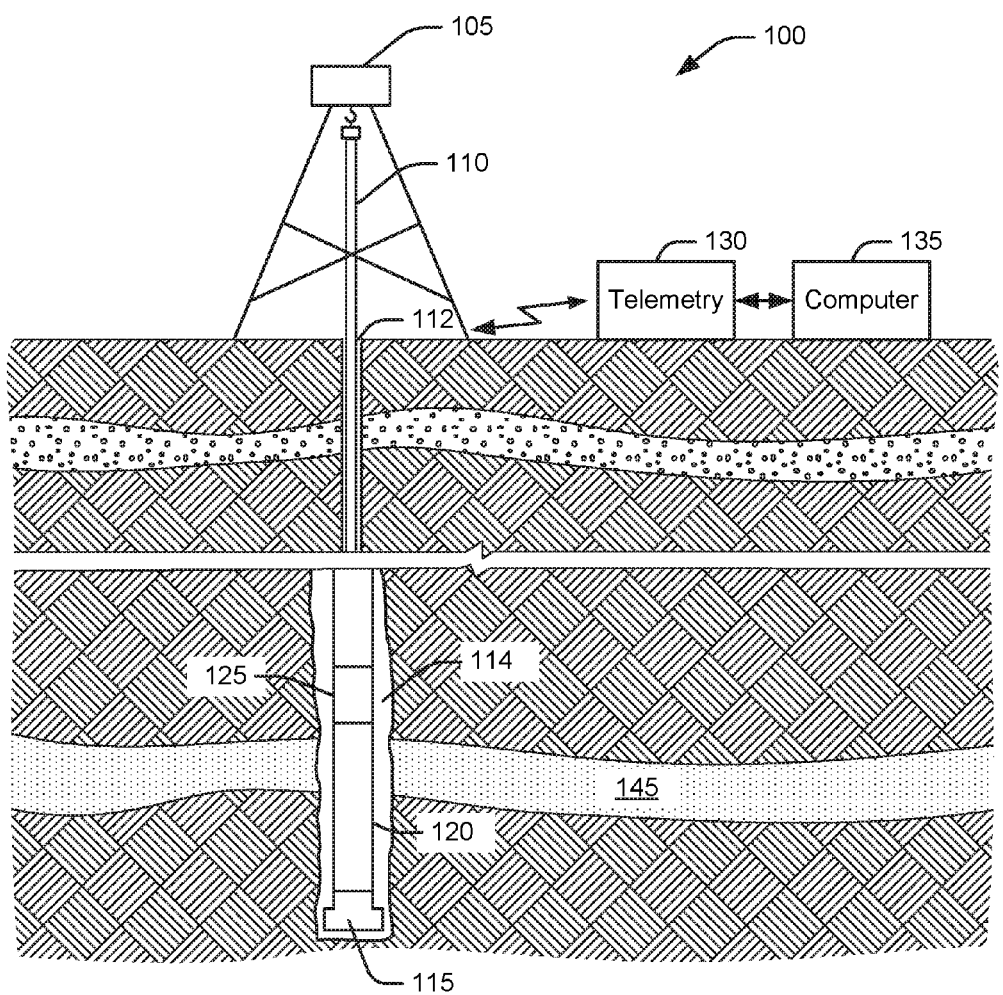
FIG. 1 illustrates a drilling system.

In one embodiment, a drilling system 100, illustrated in FIG. 1, includes a derrick 105 from which a drill string 110 is suspended in a borehole 112 that penetrates a formation 145. FIG. 1 is greatly simplified and shown schematically (i.e., where a schematic is intended to show main features or relationships but not necessarily details). Many of the elements that are used in the drilling process are not shown for simplicity of presentation. Further, while FIG. 1 shows a land-based drilling system, the equipment and techniques described herein are also useful in a sea-based drilling system, in wireline and slickline systems and operations, and in any other equipment that operates in a high-temperature environment. In one embodiment, the volume within the borehole 112 around the drill string 110 is called the annulus 114. In one embodiment, the drill string 110 includes a bit 115, a variety of actuators and sensors 120, and a telemetry section 125, through which the actuators and sensors 120 communicate with a surface telemetry system 130.

In one embodiment, a computer 135 receives data from the downhole equipment (collectively, the actuators and sensors 120 and the telemetry section 125) and sends commands to the downhole equipment 120 and 125 through the surface telemetry system 130. In one embodiment the computer 135 includes input/output devices, memory, storage, and network communication equipment, including equipment necessary to connect to the Internet (not shown in FIG. 1).

Figure 2:
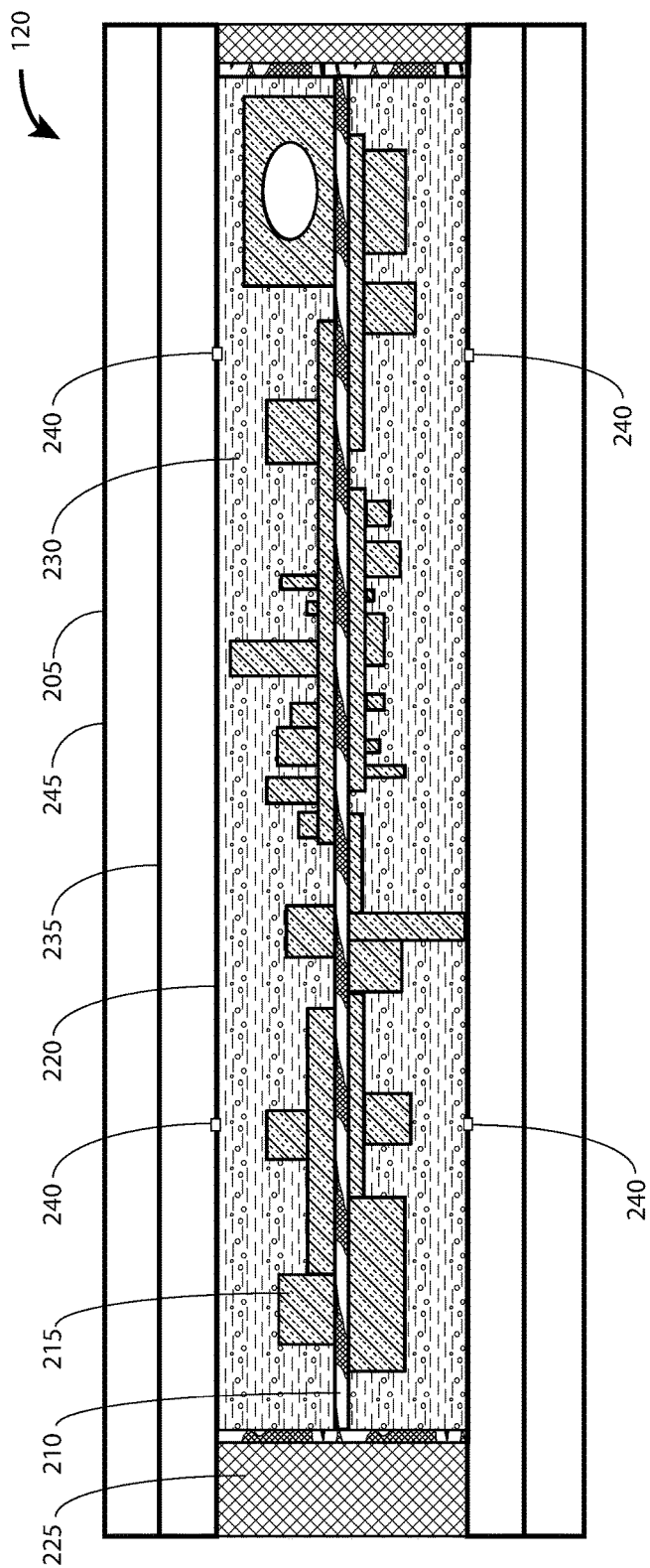
FIG. 2 illustrates a tool section with a heat-sensitive device protected by phase-change material.

In one embodiment, illustrated in FIG. 2, the actuators and sensors 120 include a tool section 205, which includes a heat-sensitive device 210, such as an electrical chassis, upon which electrical assemblies and sub-assemblies 215 are mounted, contained in a housing 220. In one embodiment, the housing 220 contains an empty volume or other components 225 that are not affected by heat or that are not protected from the heat as described herein.

In one embodiment, the housing 220 has an internal volume. In one embodiment, the heat-sensitive device 210 consumes a device percentage (%D) of the internal volume of the housing 220. For example, suppose the internal volume of the housing 220 is X cubic centimeters and the heat-sensitive device 210 displaces Y cubic centimeters. In that case, in one embodiment %D=100*Y/X.

In one embodiment, a phase-change material 230 is enclosed in the housing. In one embodiment, the phase-change material 230 consumes a phase-change material percentage (%PC) of the internal volume of the housing 220 equal to 100 percent minus %D minus an expansion percentage (%E), i.e., %PC=100%−%D−%E.

In one embodiment, the phase-change material 230 expands in volume by an amount more than 75 percent of %E upon occurrence of a phase-change event. That is, if %PC is the percentage of the housing 220 consumed by the phase-change material 230 before the phase-change event and %PC-APCE is the percentage of the housing 220 consumed by the phase-change material 230 after the phase-change event, then %PC-APCE−%PC>0.75*%E. While not all materials that might be chosen to be the phase-change material 230 will change volume upon occurrence of the phase-change event, such a volume change does not constitute an impediment to its deployment, as described below. In that case, in one embodiment, %E is very small, the phase-change material 230 displaces all (within tolerances) of the internal volume of the housing not consumed by the heat-sensitive device 220. In one embodiment, the tolerances are such that %D+%PC>95%. In one embodiment, the tolerances are such that %D+%PC>97%. In one embodiment, the tolerances are such that %D+%PC>99%.

In one embodiment, the phase-change material 230 is a heat absorbing material that changes phase, for example by melting, at a certain phase-change temperature $T_c$. In one embodiment, the absorption of heat by the phase-change material 230 at temperature $T_c$ keeps the phase-change material 230 and its immediate surroundings at that temperature ($T_c$) even if additional energy is added to the phase-change material 230. In one embodiment, the heat-sensitive device 210 is in the immediate surroundings of the phase-change material 230 so that the heat-sensitive device 210 will be kept at temperature $T_c$ for a time even after the temperature around the tool section 205 rises above $T_c$.

In one embodiment, the phase-change material 230 is constructed to conform to the three-dimensional contours of the heat-sensitive device 210. In one embodiment, a computer-aided design ("CAD") program is used to design the heat-sensitive device 210. In one embodiment, the same CAD program, or a different program, is used to map the three-dimensional contours of the heat-sensitive device 210. In one embodiment, the resulting map is used to create a mold for the phase-change material 230 to match the three-dimensional contours of the heat-sensitive device 210. In one embodiment, the mold is created using a three-dimensional ("3D") printer, such as one of the 3D printers available from STRATASYS®, MAKERBOT®, or other manufacturers. In one embodiment, the mold is used to mold the phase-change material 230 into a form that will conform closely to the heat-sensitive device 210 within the housing 220.

In one embodiment, the phase-change material 230 is placed in the housing 220 so that it can draw heat away from the heat-sensitive device 210. In one embodiment, the phase-change material 230 is placed in the housing 220 so that it is in contact with at least a portion (in one embodiment, at least 10 percent; in one embodiment, at least 20 percent; in one embodiment, at least 50 percent) of the heat-sensitive device 210. In one embodiment, a heat-conductive device or substance (such as a heat sink compound, also called thermal grease or thermal gel) (not shown) is spread between the heat-sensitive device 210 and the phase-change material 230 in order to increase the conduction of heat between the heat-sensitive device 210 and the phase-change material 230.

In one embodiment, the phase-change material 230 comprises a paraffin wax. In one embodiment, as described in M. SCHIMMELPFENNIG, K. WEBBER, F. KALB, K.-H. FELLER, T. BUTZ, M. MATTHÄI, "Volume expansion of paraffins from dip tube measurements", "the volume of paraffin waxes increases by up to 10% on heating up to the melting point." Further, according to Wikipedia, the melting point of paraffin wax is between about 46 and 68° Centigrade ("C"). In one embodiment, other possible candidate materials for the phase-change material 230, listed on page 4 of RAINER TAMME, Phase-Change Storage Systems (Institute für Technische Thermodynamik, Workshop on Thermal Storage for Trough Power Systems, Feb. 20-21, 2003), include $NaNO_3$, $NaNO_2$, NaOH, $KNO_3$, KOH, NaOH/$Na_2CO_3$(7.2%), NaCl(26.8%)/NaOH, NaCl/KCl (32.4%)/LiCl(32.8%), NaCl(5.7%)/$NaNO_3$(85.5%)/$Na_2SO_4$, NaCl(5.0%)/$NaNO_3$(5.0%), NaCl(5.0%)/$NaNO_3$, NaCl(42.5%)/KCl(20.5%)/$MgCl_2$, $KNO_3$(10%)/$NaNO_3$, $KNO_3$/KCl(4.5%), $KNO_3$/KBr(4.7%)/KCl(7.3%).

In one embodiment, the phase-change event occurs when the phase-change material 230 reaches the phase-change temperature $T_c$. In one embodiment, $T_c$ is the temperature at which the phase-change material 230 experiences an increase in volume to more than 101 percent of its room-temperature volume. In one embodiment, $T_c$ is the temperature at which the phase-change material 230 melts. In one embodiment, $T_c$ is the temperature at which the phase-change material 230 boils. In one embodiment, the phase-change event occurs when the volume of the phase-change material 230 increases to %PC-APCE.

In one embodiment, the housing 220 is contained in an expansion housing 235. In one embodiment, one or more check valves 240 penetrate a wall of the housing 220 to allow phase-change material 230 to flow from the housing 220 to the expansion housing 235. In one embodiment, the check valves 240 do not allow the phase-change material 230 to flow from the expansion housing 235 to the housing 220. In one embodiment, this arrangement allows for the possibility that the %PC-APCE−%PC>*%E portion of the phase-change material 230 that does not fit within the housing 220 would escape to the expansion housing 235. The check valves 240 allow the phase-change material 230 to escape to the expansion housing. In one embodiment, the check valves 240 are not check valves but instead allow free flow between the housing 220 and the expansion housing 235. In one embodiment, the check valves 240 are installed in such a way that the %PC-APCE−%PC>*%E portion of the phase-change material 230 that does not fit within the housing 220 escapes to the annulus 114 upon occurrence of the phase-change event. In that embodiment the expansion housing 236 is not necessary.

In one embodiment, the electrical assemblies and sub-assemblies 215 installed on the heat-sensitive device 210 are encapsulated or coated with a material, such as a conventional conformal coating, to protect the electrical assemblies and sub-assemblies 215 from damage that might otherwise be caused by exposure to the heated phase-change material 230.

In one embodiment, in which the expansion housing 235 is not present, the housing 220 is contained by a vacuum flask 245, such as a Dewar flask. In one embodiment, the expansion housing 235 and the housing 220 are contained in the vacuum flask 245.

Figure 3:
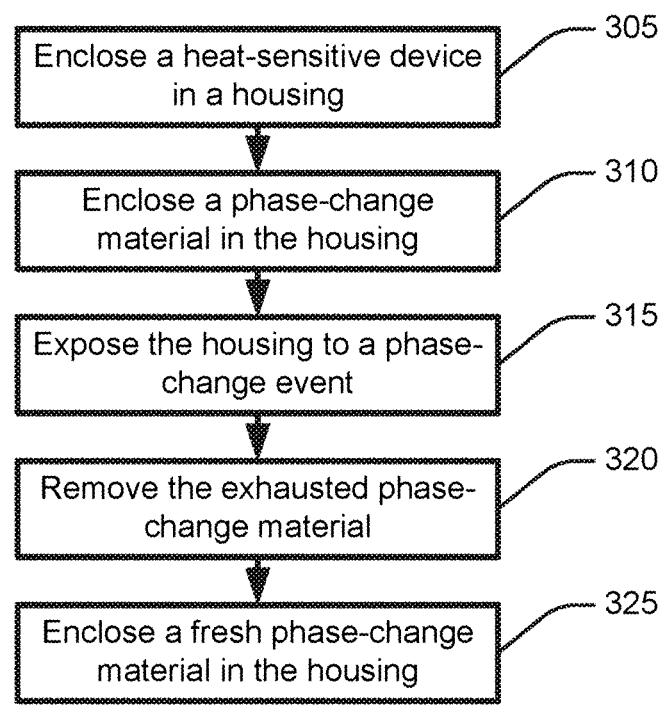
FIG. 3 is a flow chart.

In one embodiment of use, illustrated in FIG. 3, the heat-sensitive device 210 is enclosed in the housing 220 (block 305). In one embodiment, the housing 220 is enclosed in an expansion housing 235 and/or a vacuum flask 245. In one embodiment, the phase-change material 230 is enclosed in the housing 220 (block 310). In one embodiment, a drill string 110 is constructed including a tool section 205 that includes the housing 220. In one embodiment, the drill string 110 is used in a well construction operation, as illustrated in FIG. 1, which exposes the housing 220 to a phase-change event (such as high heat), causing the phase-change material to change phases (e.g., to melt) and to become exhausted (for example, by flowing from the housing 220 into the expansion housing 235 or by changing in such a way that the phase-change properties of the phase-change material 230 are no longer present or useful)(block 315). In one embodiment, the exhausted phase-change material 230 is removed from the housing 220 (block 320). In one embodiment, a fresh phase-change material 230, prepared, for example, using the mold described above, is enclosed in the housing 220 (block 325).

The word "coupled" herein means a direct connection or an indirect connection.

The text above describes one or more specific embodiments of a broader invention. The invention also is carried out in a variety of alternate embodiments and thus is not limited to those described here. The foregoing description of an embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus comprising:
   a housing containing an internal volume;
   a heat-sensitive device contained by the housing and consuming a device percentage of the internal volume, wherein the device percentage equals the percentage of the internal volume of the housing consumed by the heat-sensitive device;
   a phase-change material positioned within the housing to conduct heat from the heat-sensitive device, wherein the phase-change material consumes a percentage of the internal volume equal to 100 percent minus the device percentage minus an expansion percentage, wherein the phase-change material expands in volume by an amount more than 75 percent of the expansion percentage upon occurrence of a phase-change event;
   an expansion housing that contains the housing; and
   a valve in a wall of the housing that allows the phase-change material to flow from the housing into the expansion housing.

2. The apparatus of claim 1 wherein:
   the phase-change material comprises a paraffin wax.

3. The apparatus of claim 1 wherein the phase-change event is the heat-sensitive device reaching a phase-change temperature, $T_c$.

4. The apparatus of claim 1 further comprising:
   a vacuum flask containing the housing.

5. The apparatus of claim 1 wherein the valve is a check valve that prevents flow from the expansion housing into the housing.

6. A method comprising:
   enclosing a heat-sensitive device in a housing, wherein:
      the housing has an internal volume,
      the heat-sensitive device consumes a device percentage of the internal volume, and
      the device percentage equals the percentage of the internal volume of the housing consumed by the heat-sensitive device;
   positioning a phase-change material within the housing to conduct heat from the heat-sensitive device, wherein:

the phase-change material consumes a percentage of the internal volume equal to 100 percent minus the device percentage minus an expansion percentage, and the phase-change material expands in volume by an amount more than 75 percent of the expansion percentage upon occurrence of a phase-change event;

enclosing the housing in an expansion housing; and inserting a valve in a wall of the housing that allows phase-change material to flow from the housing into the expansion housing.

7. The method of claim 6 further comprising:

exposing the housing to a circumstance in which the phase-change event occurs, causing the phase-change material to change phases and become exhausted;

removing the exhausted phase-change material; and enclosing a fresh phase-change material in the housing.

8. The method of claim 7 wherein the circumstance comprises exposing the housing to heat such that the phase-change material reaches a phase-change temperature, $T_c$.

9. The method of claim 6 wherein inserting a valve comprises inserting a check valve that prevents flow from the expansion housing into the housing.

10. The apparatus of claim 6 further comprising:

enclosing the housing in a vacuum flask.

11. The method of claim 6 further comprising:

creating a mold for the phase-change material to match a three-dimensional contour of the heat-sensitive device; and molding the phase-change material using the mold.

12. The method of claim 11 wherein creating the mold comprises using a three dimensional printer to create the mold.

13. The method of claim 6 further comprising:

disposing the housing downhole.

14. A method comprising:

constructing a drill string, wherein the drill string comprises a tool section, wherein the tool section comprises:

a housing containing an internal volume, a heat-sensitive device contained by the housing and consuming a device percentage of the internal volume, wherein the device percentage equals the percentage of the internal volume of the housing consumed by the heat-sensitive device, and a phase-change material positioned within the housing to conduct heat from the heat-sensitive device, wherein the phase-change material consumes a percentage of the internal volume equal to 100 percent minus the device percentage minus an expansion percentage, wherein the phase-change material expands in volume by an amount more than 75 percent of the expansion percentage upon occurrence of a phase-change event.

15. The method of claim 14 further comprising:

exposing the tool section to a circumstance in which the phase-change event occurs while using the drill string to drill a well thereby causing the phase-change material to change phases and become exhausted;

removing the exhausted phase-change material; and enclosing a fresh phase-change material in the housing.

16. The method of claim 14 wherein the circumstance comprises exposing the tool section to heat such that the phase-change material reaches a phase-change temperature, $T_c$.

17. The method of claim 14 further comprising:

creating a mold for the phase-change material to match a three-dimensional contour of the heat-sensitive device; and molding the phase-change material using the mold.

18. The method of claim 14 wherein the phase-change material expands in volume upon occurrence of the phase-change event so that the volume of the heat-sensitive device plus the volume of the phase-change material is greater than 100 percent of the internal volume of the housing.

* * * * *